United States Patent
Namie

(10) Patent No.: US 10,897,231 B2
(45) Date of Patent: Jan. 19, 2021

(54) POWER AMPLIFIER CIRCUIT

(71) Applicant: Murata Manufacturing Co., Ltd., Kyoto (JP)

(72) Inventor: Hisanori Namie, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 47 days.

(21) Appl. No.: 16/438,615

(22) Filed: Jun. 12, 2019

(65) Prior Publication Data

US 2019/0393845 A1 Dec. 26, 2019

(30) Foreign Application Priority Data

Jun. 21, 2018 (JP) .................... 2018-117860

(51) Int. Cl.
*H03F 3/191* (2006.01)
*H03F 1/56* (2006.01)
*H03F 3/21* (2006.01)
*H03F 1/02* (2006.01)

(52) U.S. Cl.
CPC .......... *H03F 1/565* (2013.01); *H03F 1/0205* (2013.01); *H03F 3/21* (2013.01); *H03F 2200/165* (2013.01); *H03F 2200/222* (2013.01); *H03F 2200/451* (2013.01)

(58) Field of Classification Search
CPC .................................................. H03F 3/191
USPC ................................. 330/302, 310, 285, 296
See application file for complete search history.

(56) References Cited

U.S. PATENT DOCUMENTS

| 7,135,919 B2 * | 11/2006 | Chen ................. H03F 1/0277 330/51 |
| 7,602,240 B2 * | 10/2009 | Gao .................... H03F 1/565 330/302 |
| 7,612,616 B2 * | 11/2009 | Deng ................. H03F 1/0205 330/253 |
| 2015/0035607 A1 | 2/2015 | Takenaka |

FOREIGN PATENT DOCUMENTS

| JP | 2005-124175 A | 5/2005 |
| JP | 2005-341454 A | 12/2005 |
| JP | 2015-046858 A | 3/2015 |

\* cited by examiner

*Primary Examiner* — Henry Choe
(74) *Attorney, Agent, or Firm* — Pearne & Gordon LLP

(57) ABSTRACT

A power amplifier circuit includes a first transistor having a base or gate connected to a signal path, an emitter or source grounded via a first conductor, and a collector or drain, the first transistor amplifying an input signal supplied to the base or gate thereof along the signal path and outputting the amplified signal from the collector or drain thereof; a first element in a preceding stage of the first transistor, the first element having a first end connected to the signal path such that the first element is connected along a path branched from the signal path, and a second end grounded via a second conductor; and a first capacitor having a first end connected to a node between the emitter or source of the first transistor and the first conductor, and a second end connected to a node between the first element and the second conductor.

12 Claims, 6 Drawing Sheets

POWER AMPLIFIER CIRCUIT

This application claims priority from Japanese Patent Application No. 2018-117860 filed on Jun. 21, 2018. The content of this application is incorporated herein by reference in its entirety.

BACKGROUND

The present disclosure relates to a power amplifier circuit. Mobile communication devices such as cellular phones include power amplifier circuits having transistors. Such power amplifier circuits generally include a matching network between an input terminal and an amplifier or between amplifiers to perform impedance matching. For example, Japanese Unexamined Patent Application Publication No. 2015-46858 discloses a matching network including two capacitors connected in series and an inductor connected between ground and a node between the two capacitors.

In the power amplifier circuits described above, it is desirable that the gain be kept constant regardless of the frequency of the signal to be amplified. In a power amplifier circuit disclosed in Japanese Unexamined Patent Application Publication No. 2015-46858, however, for signals in a relatively high frequency band, for example, about the GHz band, deviation of gain characteristics may occur due to the difference in frequency.

BRIEF SUMMARY

Accordingly, the present disclosure provides a power amplifier circuit that can reduce frequency deviation of gain characteristics.

According to embodiments of the present disclosure, a power amplifier circuit includes a first transistor having a base or gate connected to a signal path, an emitter or source grounded via a first conductor, and a collector or drain, the first transistor amplifying an input signal supplied to the base or gate of the first transistor along the signal path and outputting the amplified signal from the collector or drain of the first transistor; a first element in a preceding stage of the first transistor, the first element having a first end connected to the signal path such that the first element is connected along a path branched from the signal path, and a second end grounded via a second conductor; and a first capacitor having a first end connected to a node between the emitter or source of the first transistor and the first conductor, and a second end connected to a node between the first element and the second conductor.

According to embodiments of the present disclosure, it may be possible to provide a power amplifier circuit that can reduce frequency deviation of gain characteristics.

Other features, elements, characteristics and advantages of the present disclosure will become more apparent from the following detailed description of embodiments of the present disclosure with reference to the attached drawings.

DETAILED DESCRIPTION

The following describes an embodiment of the present disclosure in detail with reference to the drawings. The same or substantially the same elements are assigned the same numerals and will not be described repeatedly.

Figure 1:
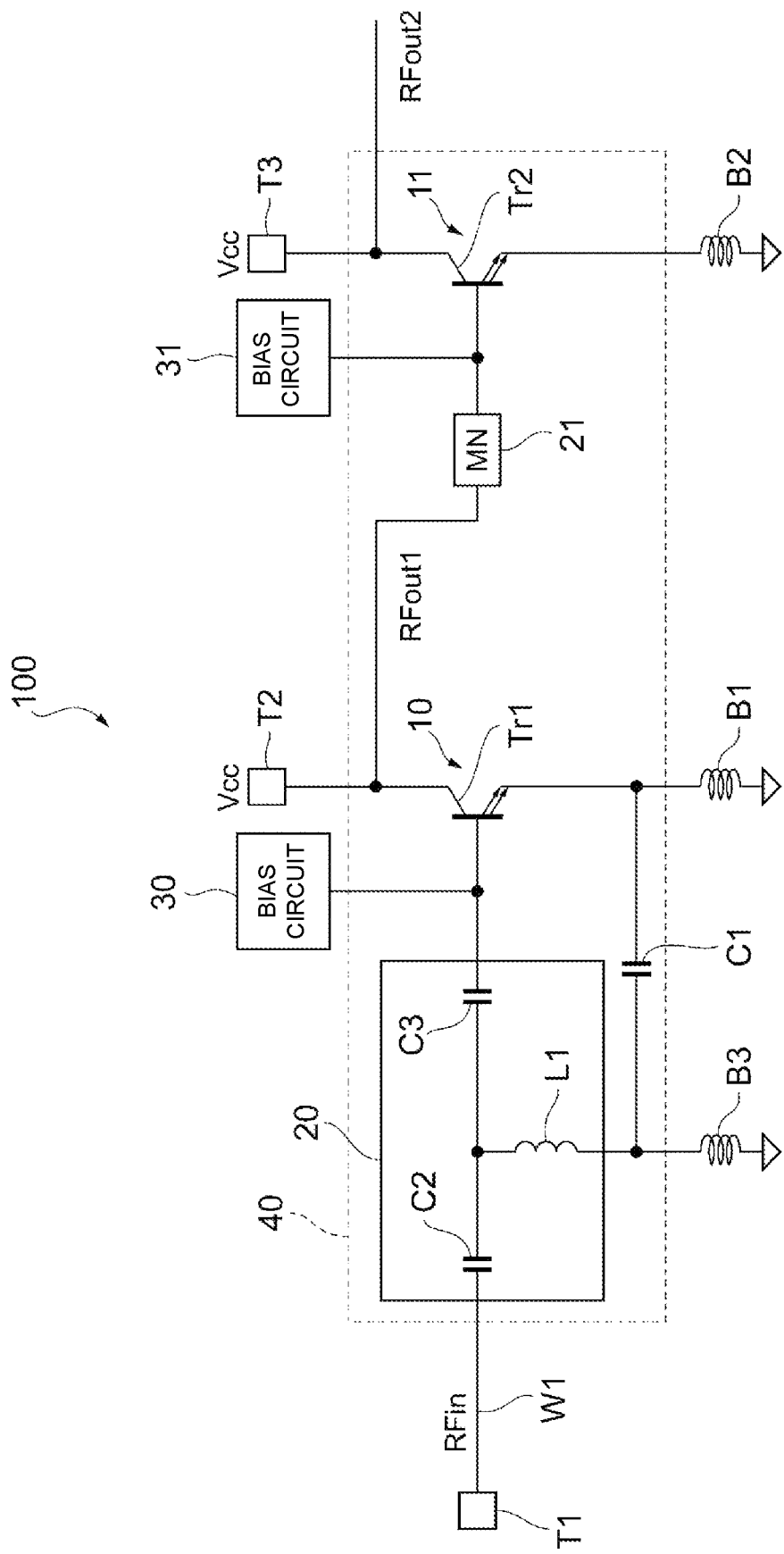
FIG. 1 illustrates an example configuration of a power amplifier circuit according to an embodiment of the present disclosure.

FIG. 1 illustrates an example configuration of a power amplifier circuit according to an embodiment of the present disclosure. A power amplifier circuit 100 illustrated in FIG. 1 is mounted in, for example, a mobile communication device such as a cellular phone and is used to amplify the power of a radio-frequency (RF) signal to be transmitted to a base station. For example, the power amplifier circuit 100 amplifies transmission signals conforming to communication standards such as the second-generation mobile communication system (2G), the third-generation mobile communication system (3G), the fourth-generation mobile communication system (4G), the fifth-generation mobile communication system (5G), Long Term Evolution Frequency Division Duplex (LTE-FDD), LTE Time Division Duplex (LTE-TDD), LTE-Advanced, and LTE-Advanced Pro. An RF signal has a frequency of about several hundreds of megahertz (MHz) to about several tens of gigahertz (GHz), for example. The power amplifier circuit 100 may amplify signals having other frequencies and conforming to other communication standards.

In this embodiment, the power amplifier circuit 100 includes, for example, amplifiers 10 and 11, matching networks (MNs) 20 and 21, bias circuits 30 and 31, a capacitor C1, and bumps B1 to B3.

The power amplifier circuit 100 amplifies the power of an RF signal in two stages. Specifically, the amplifier 10 in the initial stage (drive stage) amplifies an input signal RFin input from an input terminal T1 along a signal path W1, and outputs an amplified signal RFout1. The amplifier 11 in the subsequent stage (power stage) amplifies the amplified signal RFout1 output from the amplifier 10 in the initial stage, and outputs an amplified signal RFout2. In this embodiment, the amplifiers 10 and 11 are constituted by transistors Tr1 and Tr2, such as heterojunction bipolar transistors (HBTs), respectively. Each of the amplifiers 10 and 11 may be constituted by a field-effect transistor such as metal-oxide-semiconductor field-effect transistor (MOSFET), instead of by an HBT. When the amplifiers 10 and 11 are each constituted by a MOSFET, the terms "collector", "base", and "emitter" in the following description are changed to the terms "drain", "gate", and "source", respectively.

A collector of the transistor Tr1 (first transistor) is supplied with a power supply voltage Vcc from a power supply terminal T2. A base of the transistor Tr1 is connected to the signal path W1 and is supplied with the input signal RF in from the input terminal T1. An emitter of the transistor Tr1 is grounded via the bump B1. The base of the transistor Tr1 is also supplied with a bias current or voltage from the bias circuit 30. Accordingly, the amplified signal RFout1, which is obtained by amplifying the input signal RFin, is output from the collector of the transistor Tr1. The gain of the transistor Tr1 may be controlled by the bias current or voltage supplied from the bias circuit 30.

A collector of a transistor Tr2 (second transistor) is supplied with the power supply voltage Vcc from a power supply terminal T3. A base of the transistor Tr2 is supplied with the amplified signal RFout2 from the collector of the transistor Tr1 via the matching network 21. An emitter of the transistor Tr2 is grounded via the bump B2. The base of the transistor Tr2 is also supplied with a bias current or voltage from the bias circuit 31. Accordingly, the amplified signal RFout2, which is obtained by amplifying the amplified signal RFout1, is output from the collector of the transistor Tr2. The gain of the transistor Tr2 may be controlled by the bias current or voltage supplied from the bias circuit 31.

The matching network 20 is located in the preceding stage of the amplifier 10 in the initial stage. The matching network 20 matches the impedance of a circuit (not illustrated) located in the preceding stage of the matching network 20 and the impedance of the amplifier 10. The matching network 21 is located between the amplifier 10 in the initial stage and the amplifier 11 in the subsequent stage. The matching network 21 matches the impedance of the amplifier 10 and the impedance of the amplifier 11.

In this embodiment, as an example, the matching network 20 is constituted by a T-type filter circuit including two capacitors C2 and C3 and a single inductor L1. Specifically, the capacitor C2 (second capacitor) and the capacitor C3 (third capacitor) are connected in series along the signal path W1 through which the input signal RFin is supplied. The inductor L1 (first element) has a first end connected to a node between the capacitor C2 and the capacitor C3, and a second end grounded via the bump B3. That is, the inductor L1 is connected to the signal path W1 such that the inductor L1 is located along a path branched from the signal path W1. In the present disclosure, the first element is not limited to an inductor. Examples of the first element include passive elements such as a capacitor and a resistor. The matching network 21 may have a configuration similar to that of the matching network 20 and will not be described herein.

In this embodiment, the transistors Tr1 and Tr2 and the matching networks 20 and 21 are formed on a semiconductor chip 40 manufactured with an HBT process. The semiconductor chip 40 is mounted on a substrate (not illustrated) by so-called flip-chip technology. In this case, the emitter of the transistor Tr1, the emitter of the transistor Tr2, and the second end of the inductor L1 in the matching network 20 are electrically connected to a ground portion disposed on the substrate (not illustrated) via the bumps B1 to B3, respectively. That is, the bumps B1 and B3 are a specific example of a first conductor and a second conductor for electrically connecting the emitter of the transistor Tr1 and the second end of the inductor L1 to the ground portion on the substrate, respectively. The ground portion on the substrate is an electrode supplied with a reference potential (e.g., a ground potential) among electrodes disposed on the substrate. In FIG. 1, the bumps B1 to B3 and lines, vias, and the like on the semiconductor chip 40, which lead to the bumps B1 to B3, are schematically illustrated as having inductance components. Each of the bumps B1 to B3 may be, for example but not limited to, a copper pillar bump.

The capacitor C1 (first capacitor) has a first end connected to the emitter of the transistor Tr1 (i.e., a node between the emitter of the transistor Tr1 and the bump B1), and a second end connected to the second end of the inductor L1 included in the matching network 20 (i.e., a node between the inductor L1 and the bump B3). The capacitor C1 is disposed on the semiconductor chip 40, for example, and has a function of feeding back a signal to the base of the transistor Tr1 from the emitter of the transistor Tr1. Specifically, a portion of the amplified signal RFout1 flowing through the emitter of the transistor Tr1 passes in sequence through the capacitor C1, the inductor L1, and the capacitor C3, and is fed back to the base of the transistor Tr1. Accordingly, the following effects are achieved.

If the power amplifier circuit 100 does not include the capacitor C1, for example, the gain decreases with an increase in the frequency of the input signal RFin. As a result, frequency deviation of gain characteristics may occur. In this embodiment, in contrast, a signal is fed back to the base of the transistor Tr1 from the emitter of the transistor Tr1 through the capacitor C1. Accordingly, a portion of the amplified signal RFout1 is supplied again to the transistor Tr1 as an input signal. Thus, the decrease in gain can be small even if the frequency of the input signal RFin increases. As a result, frequency deviation of gain characteristics can be reduced.

Furthermore, adjusting the capacitance value of the capacitor C1 can adjust the amount of feedback to the transistor Tr1 and can control gain characteristics.

In the power amplifier circuit 100, the amplifier 10 in the initial stage includes the capacitor C1. However, the amplifier 11 in the subsequent stage may include an element corresponding to the capacitor C1. For example, the amplifier 11 in the subsequent stage, in addition to or instead of the initial stage, may include an element corresponding to the capacitor C1.

The power amplifier circuit 100 may include three or more stages of amplifiers, instead of two stages of amplifiers. For example, when the power amplifier circuit 100 includes three stages of amplifiers, the power amplifier circuit 100 may reduce frequency deviation of gain characteristics if the power amplifier circuit 100 does not include the capacitor C1. However, the three-stage configuration may increase current consumption, compared to the two-stage configuration. That is, the power amplifier circuit 100 having a two-stage configuration can reduce frequency deviation of gain characteristics while avoiding an increase in current consumption, compared to when the power amplifier circuit 100 has a three-stage configuration.

Furthermore, the matching network 20 is not limited to the C-L-C T-type filter circuit illustrated in FIG. 1. Alternatively, the matching network 20 may be constituted by, instead of a C-L-C T-type filter circuit, an L-C-L T-type filter circuit or a C-L-C or L-C-L π-type filter circuit, for example. When the matching network 20 is constituted by such a filter circuit as described above, an element connected along a path branched from the signal path W1 (e.g., a capacitor in the case of an L-C-L T-type filter circuit) may be connected to a ground portion on the substrate via a bump in a manner similar to that of the inductor L1 described above, and the second end of the capacitor C1 may be connected between the element and the bump.

Figure 2:
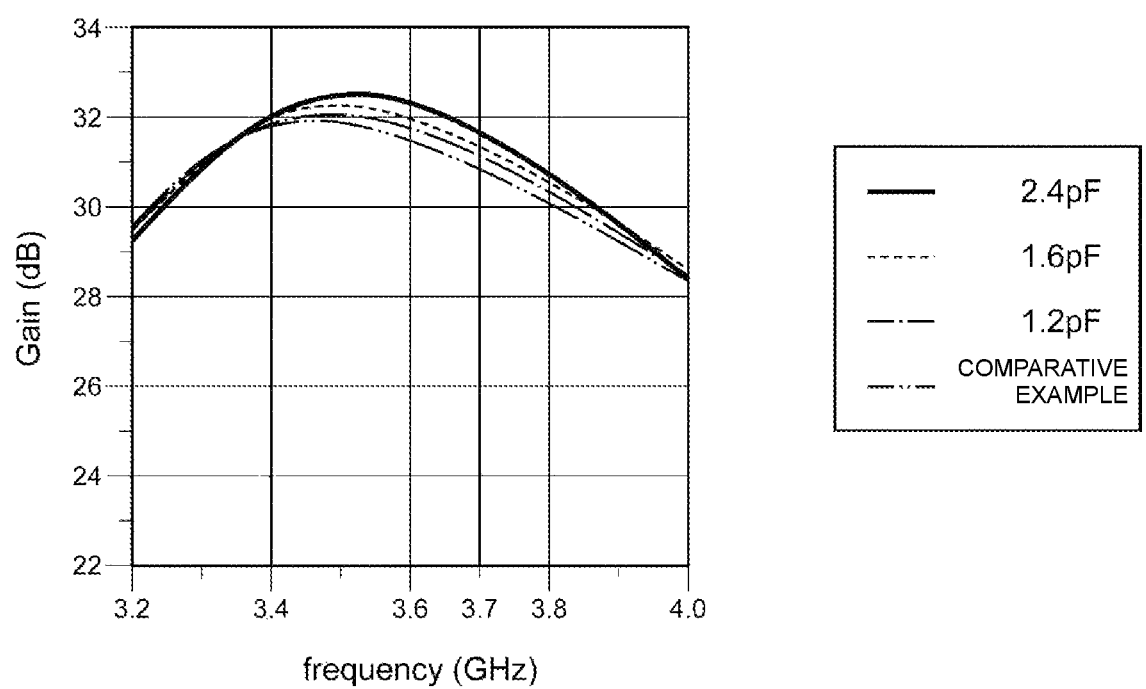
FIG. 2 is a graph depicting simulation results of gain-frequency characteristics of the power amplifier circuit according to this embodiment and a power amplifier circuit according to a comparative example.

FIG. 2 is a graph depicting simulation results of gain-frequency characteristics of a power amplifier circuit according to this embodiment and a power amplifier circuit according to a comparative example. Specifically, the power amplifier circuit according to this embodiment has a configuration in which, as illustrated in FIG. 1, the amplifier 10 in the initial stage includes the capacitor C1, whereas the amplifier 11 in the subsequent stage does not include the capacitor C1. In contrast, the power amplifier circuit according to the comparative example has a configuration in which none of the amplifier in the initial stage and the amplifier in the subsequent stage includes the capacitor C1. This embodiment provides results obtained when the capacitance value of the capacitor C1 was set to 0.0 pF (the comparative example), 1.2 pF, 1.6 pF, and 2.4 pF. In the graph illustrated in FIG. 2, the horizontal axis represents the frequency (GHz) of an input signal, and the vertical axis represents the gain (dB) of the power amplifier circuit, with the range of 3.4 GHz to 3.7 GHz being the frequency band of the signal to be amplified.

First, the gain of the power amplifier circuit according to the comparative example is about 32 dB when the frequency of the input signal is 3.4 GHz. The gain of the power amplifier circuit according to the comparative example decreases with an increase in the frequency of the input signal and is about 31 dB when the frequency of the input signal is 3.7 GHz. That is, the power amplifier circuit according to the comparative example is found to have gain variation within the frequency band and to have frequency deviation of gain characteristics. In the power amplifier circuit 100, in contrast, the decrease in gain with an increase in frequency is found to be less than that in the comparative example, regardless of the capacitance value of the capacitor C1. In addition, the larger the capacitance value of the capacitor C1, the less the decrease in gain. For example, when the capacitance value is 2.4 pF, the gain remains around 32 dB even at 3.7 GHz. That is, the power amplifier circuit 100 may be able to reduce frequency deviation of gain characteristics, compared to the comparative example.

Figure 3:
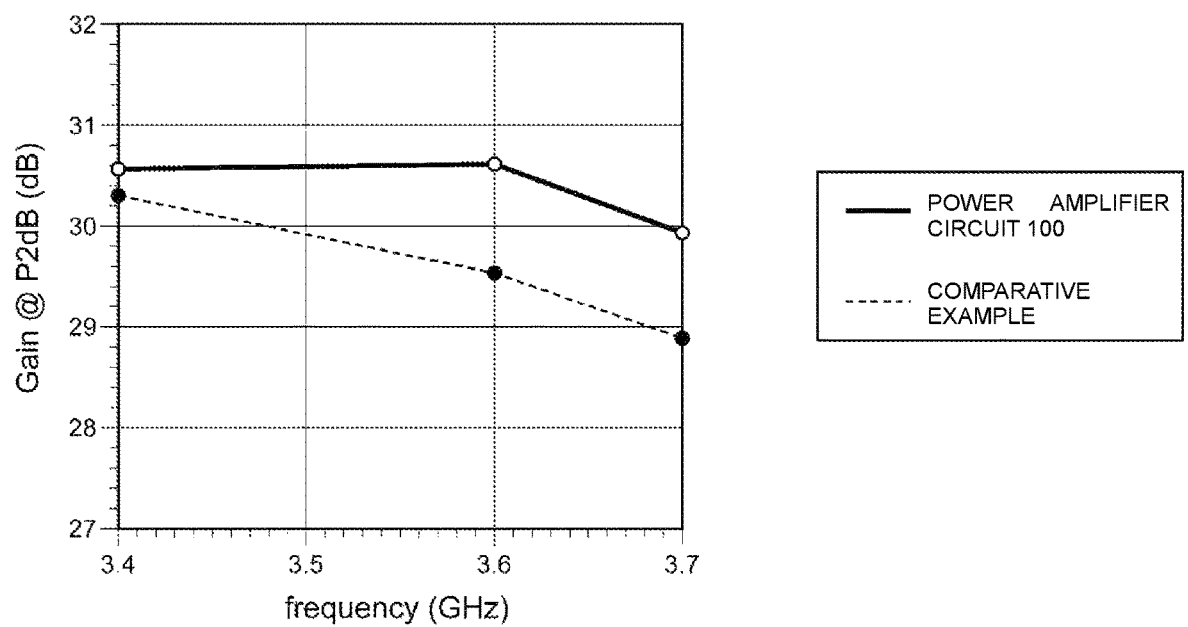
FIG. 3 is a graph depicting simulation results of P2dB of the power amplifier circuit according to this embodiment and the power amplifier circuit according to the comparative example.

FIG. 3 is a graph depicting simulation results of the 2-dB gain compression point (so-called P2dB) of the power amplifier circuit according to this embodiment and the power amplifier circuit according to the comparative example. In the graph illustrated in FIG. 3, the horizontal axis represents frequency (GHz), and the vertical axis represents P2dB (dB). In FIG. 3, the calculation results of simulation when the output power is greater than that in the simulation illustrated in FIG. 2 are illustrated.

As illustrated in FIG. 3, in the power amplifier circuit according to the comparative example, the P2dB is about 30.4 dB when the frequency is 3.4 GHz and decreases to about 29 dB when the frequency is 3.7 GHz. In the power amplifier circuit 100 according to this embodiment, in contrast, the P2dB remains around 30.6 dB both when the frequency is 3.4 GHz and when the frequency is 3.6 GHz. When the frequency is 3.7 GHz, the P2dB slightly decreases but is kept at about 30 dB. This may indicate that the power amplifier circuit 100 may be able to reduce frequency deviation of gain characteristics, compared to the comparative example, even if the output power is relatively high.

An excessively small capacitance of the capacitor C1 decreases the amount of feedback, which in turn reduces the effect of providing the capacitor C1. On the other hand, an excessively large capacitance increases the amount of feedback, which may in turn lead to oscillation of the transistor Tr1. It is thus desirable that the capacitance value of the capacitor C1 falls within an appropriate range. This will be described with reference to FIG. 4 and FIG. 5.

Figure 4:
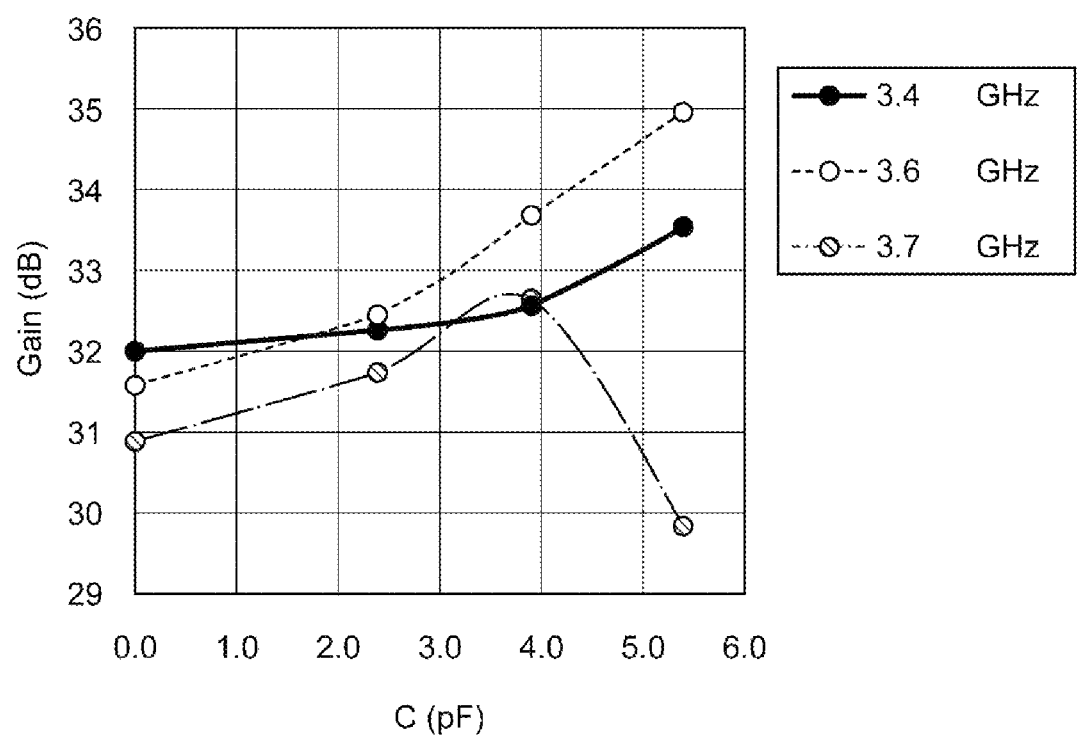
FIG. 4 is a graph depicting the relationship between the capacitance values of a capacitor and gains.

FIG. 4 is a graph depicting the relationship between the capacitance values of the capacitor C1 and gains. Specifically, FIG. 4 illustrates gains calculated in the power amplifier circuit 100 when the frequency of the input signal RFin was set to 3.4 GHz, 3.6 GHz, and 3.7 GHz and the capacitance value of the capacitor C1 was set to 0.0 pF (the comparative example), 2.4 pF, 3.9 pF, and 5.4 pF. In the graph illustrated in FIG. 4, the horizontal axis represents the capacitance value of the capacitor C1 (pF), and the vertical axis represents gain (dB).

As illustrated in FIG. 4, as the capacitance value of the capacitor C1 increases from 0.0 pF, the gain also increases. However, for example, when the capacitance value exceeds 4.0 pF, the gain starts to decrease, in particular, when the frequency is 3.7 GHz. It is thus desirable that the capacitance value of the capacitor C1 be in the range from about 2.0 pF to about 4.0 pF.

Figure 5:
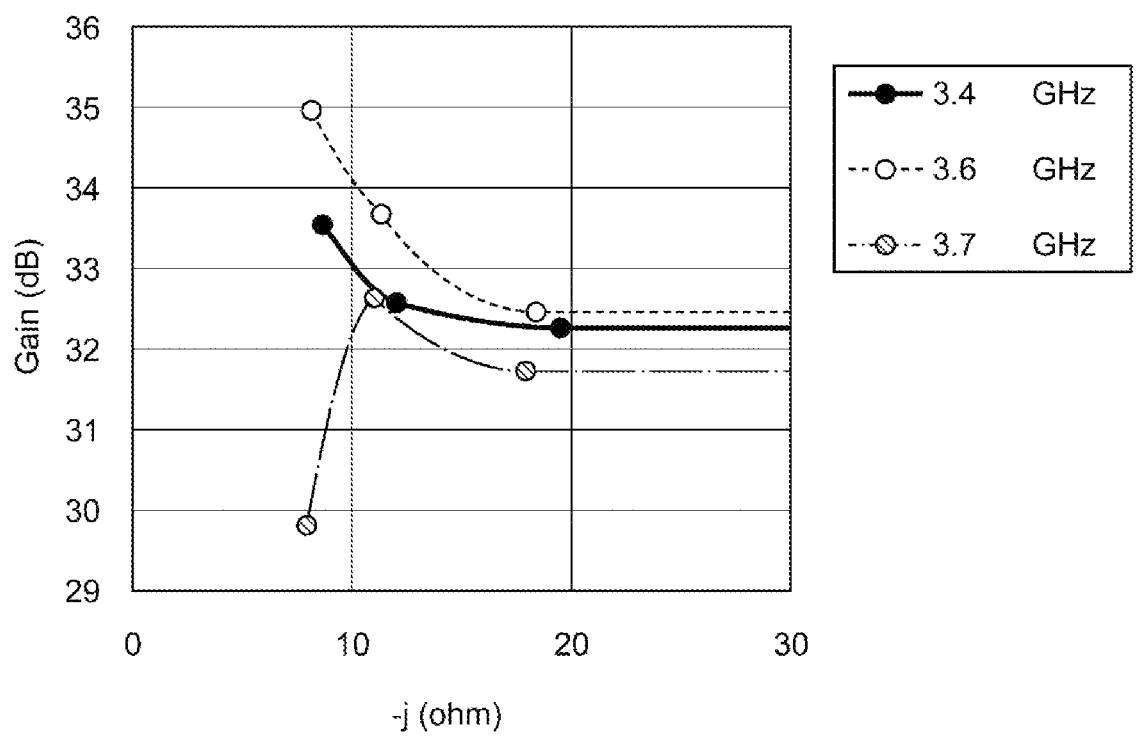
FIG. 5 is a graph depicting the relationship between impedance values and gains when the capacitor C1 is expressed as an impedance.

FIG. 5 is a graph depicting the relationship between impedance values and gains when the capacitor C1 is expressed as an impedance in the simulation illustrated in FIG. 4. The impedance value Z of the capacitor C1 is determined using $Z=1/2\pi fC$ (f: frequency, C: capacitance value). In the graph illustrated in FIG. 5, the horizontal axis represents the impedance value ($-j\ \Omega$) of the capacitor C1, and the vertical axis represents gain (dB).

As illustrated in FIG. 5, when the capacitor C1 is expressed as an impedance, the gain characteristics are in the range from about 32 dB to about 34 dB when the impedance value is in the range from about $-10j\ \Omega$ to about $-20j\ \Omega$, which is found to be desirable.

In the embodiment described above, the semiconductor chip 40 is mounted on a substrate by flip-chip technology, by way of example. Instead of flip-chip technology, the semiconductor chip 40 may be mounted on a substrate by so-called wire-bonding technology. In this case, the emitter of the transistor Tr1 and the second end of the inductor L1 may be electrically connected to the ground portion on the substrate via via-holes in a semiconductor substrate, instead of via the bumps B1 and B3. That is, the via-holes are also a specific example of the first conductor and the second conductor. The configuration described above may also achieve effects similar to those of the embodiment described above.

Figure 6:
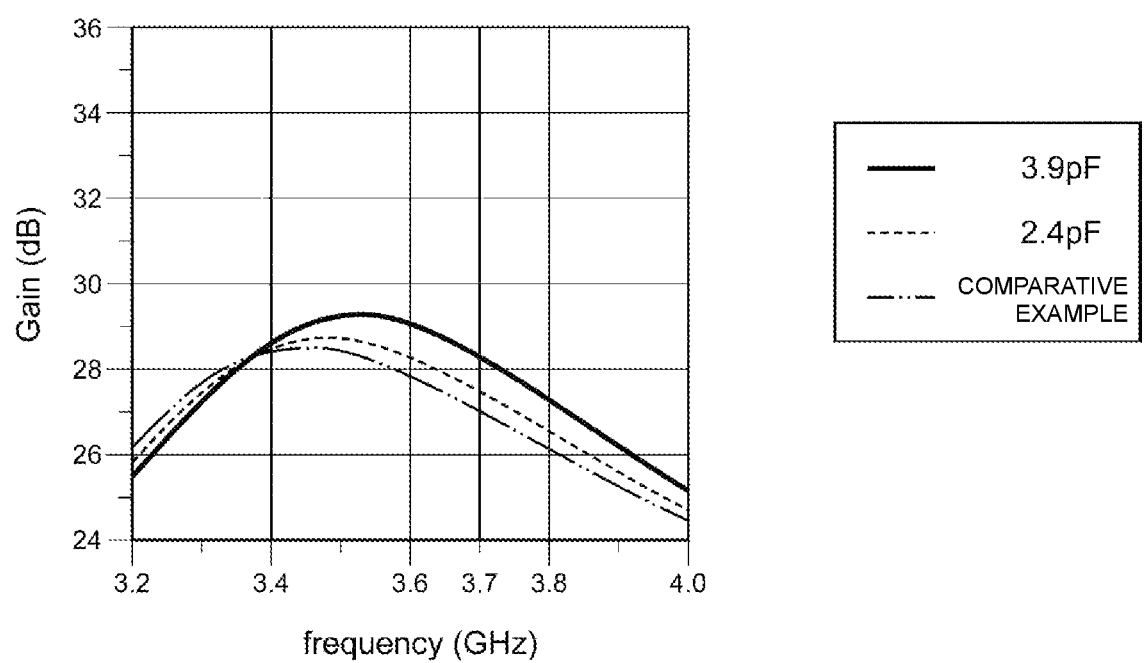
FIG. 6 is a graph depicting simulation results of gain-frequency characteristics of a power amplifier circuit including via-holes and the power amplifier circuit according to the comparative example.

FIG. 6 is a graph depicting simulation results of gain-frequency characteristics of a power amplifier circuit, which is the same as the power amplifier circuit 100, except that it includes via-holes instead of the bumps B1 and B3, and the power amplifier circuit according to the comparative example. Specifically, FIG. 6 illustrates gains calculated when the frequency of the input signal RFin was in the range from 3.2 GHz to 4.0 GHz and the capacitance value of the capacitor C1 was set to 0.0 pF (the comparative example), 2.4 pF, and 3.9 pF. In the graph illustrated in FIG. 6, the horizontal axis represents frequency (GHz), and the vertical axis represents gain (dB).

FIG. 6 indicates that even with wire-bonding technology, the frequency deviation of the gain characteristics in the frequency band of 3.4 GHz to 3.7 GHz is reduced, compared to the power amplifier circuit according to the comparative example. The conductors that connect the emitter of the transistor Tr1 and the second end of the inductor L1 to the ground portion on the substrate are not limited to bumps or via-holes and may be components made of any other conductive material, such as wires.

An exemplary embodiment of the present disclosure has been described. The power amplifier circuit 100 includes the transistor Tr1 having a base or gate connected to the signal path W1, an emitter or source grounded via the bump B1, and a collector or drain, the transistor Tr1 amplifying the input signal RFin supplied to the base or gate of the transistor Tr1 along the signal path W1 and outputting the amplified signal RFout1 from the collector or drain of the transistor Tr1; the inductor L1 in the preceding stage of the transistor Tr1, the inductor L1 having a first end connected to the signal path W1 such that the inductor L1 is connected along a path branched from the signal path W1, and a second end grounded via the bump B3; and the capacitor C1 having a first end connected to a node between the emitter or source of the transistor Tr1 and the bump B1, and a second end connected to a node between the inductor L1 and the bump B3. With this configuration, a signal is fed back to the base of the transistor Tr1 from the emitter of the transistor Tr1 via the capacitor C1. Accordingly, the decrease in gain can be small even if the frequency of the input signal RFin increases, and frequency deviation of gain characteristics can be reduced.

In the power amplifier circuit 100, furthermore, the emitter of the transistor Tr1 and the second end of the inductor L1 may be grounded via via-holes instead of via the bumps B1 and B3.

In the power amplifier circuit 100, furthermore, the matching network 20 may, for example but not limited to, include the capacitor C2 and the capacitor C3 connected in series along the signal path W1, and an inductor having a first end connected to a node between the capacitor C2 and the capacitor C3.

Furthermore, the power amplifier circuit 100 includes the transistor Tr2 in the subsequent stage of the transistor Tr1. Whereas the capacitor C1 is connected to the transistor Tr1, an element corresponding to the capacitor C1 is not connected to the transistor Tr2. With this configuration, the influence of variations in phase or the like caused when the capacitor C1 is connected can be reduced.

The embodiment described above is intended for easy understanding of the present disclosure, and it is not intended to construe the present disclosure in a limiting fashion. Various modifications or improvements can be made to the present disclosure without departing from the gist of the present disclosure, and equivalents thereof are also included in the present disclosure. That is, the embodiment may be appropriately modified in design by those skilled in the art, and such modifications also fall within the scope of the present disclosure so long as the modifications include the features of the present disclosure. For example, the elements included in the embodiment and the arrangement, materials, conditions, shapes, sizes, and the like thereof are not limited to those described in the illustrated examples but can be modified as appropriate. In addition, the elements included in the embodiment can be combined as much as technically possible, and such combinations of elements also fall within the scope of the present disclosure so long as the combinations of elements include the features of the present disclosure.

While embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier circuit comprising:
   a first transistor having a base or gate connected to a signal path, an emitter or source grounded via a first conductor, and a collector or drain, wherein the first transistor is configured to amplify an input signal supplied to the base or gate of the first transistor along the signal path and to output the amplified signal from the collector or drain of the first transistor;
   a first element in a preceding stage of the first transistor, the first element having a first end connected to the signal path such that the first element is connected along a path branched from the signal path, and a second end grounded via a second conductor; and
   a first capacitor having a first end connected to a node between the emitter or source of the first transistor and the first conductor, and a second end connected to a node between the first element and the second conductor.

2. The power amplifier circuit according to claim 1, wherein the first conductor includes a bump that electrically connects the emitter or source of the first transistor to a ground portion on a substrate, and
   wherein the second conductor includes a bump that electrically connects the second end of the first element to the ground portion.

3. The power amplifier circuit according to claim 1, wherein the first conductor includes a via-hole that electrically connects the emitter or source of the first transistor to a ground portion on a substrate, and
   wherein the second conductor includes a via-hole that electrically connects the second end of the first element to the ground portion.

4. The power amplifier circuit according to claim 1, further comprising
   a second capacitor and a third capacitor in the preceding stage of the first transistor, the second capacitor and the third capacitor being connected in series along the signal path,
   wherein the first element includes an inductor having a first end connected to a node between the first capacitor and the second capacitor.

5. The power amplifier circuit according to claim 2, further comprising
   a second capacitor and a third capacitor in the preceding stage of the first transistor, the second capacitor and the third capacitor being connected in series along the signal path,
   wherein the first element includes an inductor having a first end connected to a node between the first capacitor and the second capacitor.

6. The power amplifier circuit according to claim 3, further comprising
   a second capacitor and a third capacitor in the preceding stage of the first transistor, the second capacitor and the third capacitor being connected in series along the signal path,
   wherein the first element includes an inductor having a first end connected to a node between the first capacitor and the second capacitor.

7. The power amplifier circuit according to claim 1, further comprising
   a second transistor in a subsequent stage of the first transistor.

8. The power amplifier circuit according to claim 2, further comprising
   a second transistor in a subsequent stage of the first transistor.

9. The power amplifier circuit according to claim 3, further comprising
   a second transistor in a subsequent stage of the first transistor.

10. The power amplifier circuit according to claim 4, further comprising
    a second transistor in a subsequent stage of the first transistor.

11. The power amplifier circuit according to claim 7, wherein an emitter or a source of the second transistor is grounded via a bump.

12. The power amplifier circuit according to claim 1, wherein the first element is one of a capacitor or a resistor, the capacitor or resistor having a first end connected to a node between the first capacitor and the second capacitor.

\* \* \* \* \*